(12) United States Patent
Davidson

(10) Patent No.: US 8,982,007 B2
(45) Date of Patent: Mar. 17, 2015

(54) TRANSFER UNIT FOR RADIO FREQUENCY SIGNALS AND METHOD FOR ALTERNATIVELY USING AN ELECTRICAL ANTENNA OR A MAGNETIC ANTENNA WITH A CLASSIC ANTENNA TUNER

(75) Inventor: Ronald Davidson, Clamart (FR)

(73) Assignee: Comrod AS, Tau (NO)

( * ) Notice: Subject to any disclaimer, the term of this patent is extended or adjusted under 35 U.S.C. 154(b) by 423 days.

(21) Appl. No.: 12/989,946

(22) PCT Filed: May 4, 2009

(86) PCT No.: PCT/NO2009/000171
§ 371 (c)(1),
(2), (4) Date: Nov. 30, 2010

(87) PCT Pub. No.: WO2009/136794
PCT Pub. Date: Nov. 12, 2009

(65) Prior Publication Data
US 2011/0273354 A1    Nov. 10, 2011

(30) Foreign Application Priority Data
May 8, 2008 (NO) ..................................... 20082153

(51) Int. Cl.
*H01Q 1/50* (2006.01)
*H03H 7/38* (2006.01)
(Continued)

(52) U.S. Cl.
CPC ................. *H01Q 7/005* (2013.01); *H03H 7/38* (2013.01); *H01Q 9/145* (2013.01)
USPC ............................ 343/852; 343/861; 333/17.3

(58) Field of Classification Search
USPC ......... 343/745, 850, 852, 858, 861; 333/17.1, 333/17.3, 32; 455/123
See application file for complete search history.

(56) References Cited

U.S. PATENT DOCUMENTS 3,281,721 A * 10/1966 Clark .......................... 333/17.1
3,582,774 A * 6/1971 Forgacs ........................ 324/649
(Continued)

OTHER PUBLICATIONS

International Search Report for parent application PCT/NO2009/000171, having a mailing date of Aug. 6, 2009.
(Continued)

*Primary Examiner* — Michael C Wimer
(74) *Attorney, Agent, or Firm* — Andrus Intellectual Property Law, LLP

(57) ABSTRACT

A transfer unit for transferring a radio frequency signal between a classical antenna tuner and an antenna where the transfer unit comprises a switch for alternatively selecting a first direct route for the radio frequency signal between the tuner and the antenna or a second route via a reactive element; said reactive element comprising a variable serial capacitance and a shunt inductance connected to system earth; and where a control unit controls the switch and is adapted to select the first route when the frequency is above a predetermined value and otherwise select the second route. The variable serial capacitance comprises a set of capacitors organized as a set of binary weighted parallel capacitance values, and the transfer unit further comprises switches to engage or disengage each capacitor from the reactive element to increase or decrease the resulting capacitance as the radio frequency is decreased or increased. The control unit can use a subset of the capacitors for one range of frequencies and a different subset of the capacitors for a different range of frequencies. The control unit can alternatively measure the radio frequency by means of a sensor or receive frequency values via a data link.

19 Claims, 3 Drawing Sheets

(51) Int. Cl.
  *H01Q 7/00*  (2006.01)
  *H01Q 9/14*  (2006.01)

(56)  References Cited

U.S. PATENT DOCUMENTS

| | | | |
|---|---|---|---|
| 3,601,717 A | * | 8/1971 | Kuecken ..................... 333/17.1 |
| 3,794,941 A | | 2/1974 | Templin |
| 4,201,960 A | | 5/1980 | Skutta et al. |
| 4,343,001 A | * | 8/1982 | Anderson et al. ............. 343/745 |
| 4,893,131 A | * | 1/1990 | Smith et al. .................. 343/713 |
| 5,072,233 A | | 12/1991 | Zanzig |
| 5,589,844 A | | 12/1996 | Belcher et al. |
| 7,180,467 B2 | * | 2/2007 | Fabrega-Sanchez et al. . 343/861 |

OTHER PUBLICATIONS

Written Opinion for parent application PCT/NO2009/000171, having a mailing date of Aug. 6, 2009.

* cited by examiner

TRANSFER UNIT FOR RADIO FREQUENCY SIGNALS AND METHOD FOR ALTERNATIVELY USING AN ELECTRICAL ANTENNA OR A MAGNETIC ANTENNA WITH A CLASSIC ANTENNA TUNER

CROSS-REFERENCE TO RELATED APPLICATIONS

This application is the U.S. national stage application of International Application No. PCT/NO2009/000171, filed May 4, 2009, which International application was published on Nov. 12, 2009, as International Publication No. WO 2009/136794 A1 in the English language, which application is incorporated herein by reference. The International application claims priority of Norwegian Patent Application No. 20082153, filed May 8, 2008, which application is incorporated herein by reference.

BACKGROUND

A magnetic loop antenna is often preferred for the Near Vertical Incidence Sky-wave (NVIS) high frequency radio communication mode. Depending on range, terrain, ionospheric conditions and other factors, units participating in a local or regional radio communication network may need to switch to and from NVIS mode, especially when mobile units are involved. Switching between communication modes typically implicates changing the operating radio frequency range and switching between a magnetic antenna such as a magnetic loop or half loop antenna, and an electrical antenna such as a whip or wire antenna. It is well known in the art to insert a tunable impedance matching element between the radio set and the antenna to optimize power transfer at different radio frequencies.

U.S. Pat. No. 3,794,941 discloses an antenna tuner comprising a control circuit to automatically tune the impedance matching element. In a similar tuner disclosed in U.S. Pat. No. 5,589,844 the impedance of the antenna is conjugately matched to the output of the radio set amplifier output stage by using a so-called pi-type impedance matching network having shunt capacitive circuit elements and one or more series inductive circuit elements.

Those and similar known antenna tuners having series inductance and parallel (shunt) capacitance are referred to as the classical tuner in the following.

The classical antenna tuner does not work efficiently with a magnetic antenna due to its low radiating resistance, and thereby high currents. For acceptable efficiency, the sum of losses in the antenna tuner and the magnetic antenna must be kept well below losses normally accepted for a classical antenna tuner with an electrical antenna.

A simple solution is to use different tuners for the magnetic and the electrical antenna, but this means increased weight and cost, and it is highly impractical in field operations.

A tuned magnetic antenna system has a narrow efficient bandwidth and the impedance matching element must be tuned to a relatively high degree of accuracy. A variable capacitance may be integrated with the magnetic antenna, for example as disclosed in U.S. Pat. No. 5,072,233, but the complexity and cost increases and accurate tuning may be difficult. Tuners with an integrated variable capacitance for tuning to a magnetic antenna are also known in the art.

Because these systems work at a nominal fifty ohms, they have either an infinitely variable capacitor or a bank of multiple capacitors in parallel to obtain a good tune. With an array of twelve parallel capacitors organized in a binary series where the capacitance doubles for each capacitor, the minimum capacitance step between capacitance settings is $1/4096$ which requires capacitance precision of the order 0.025% ($2^{12}=4096$). It is currently not possible to manufacture capacitors with this precision. Indeed, it is impossible to install capacitors with this precision, especially for small values of capacitance of the order of 1 picofarad (pF) because of the tolerances in manufacture. Therefore complicated algorithms or look up tables must be used in order to obtain the linearization of the capacitor bank after manufacture. This is well known in the art.

As the frequency is increased, the variable capacitance must be reduced according to the relationship $$f = 1/2\pi\sqrt{LC}$$

where $\pi$ is the constant pi=3.14 ..., L is the inductance and C is the capacitance.

However, there is a limit to the minimum value of C even with all the capacitors open-circuited because of stray capacitances. Consequently, many integrated systems have a maximum operating frequency around 15 MHz.

Higher operating frequencies require an additional oscillating circuit. An inductance can be connected across the capacitance. Alternatively the size of the antenna can be reduced. Although adding an inductor may increase the maximum operating frequency to 30 MHz, the efficiency decreases due to important resistive losses in the inductor due to the large current oscillating in the circuit created by this new inductor and the capacitor and which does not contribute to the radiated energy. Obviously, reducing the size of the antenna also leads to a less efficient system.

SUMMARY

It is an object of the present inventive concept to provide a radio signal transfer unit that allows a classical antenna tuner to work efficiently with magnetic and electrical antenna alternatives. It is also an object of the inventive concept to achieve good tuning with a magnetic antenna using capacitors of readily available precision.

The objects are achieved by means as described in the following description and in subsequent patent claims.

According to the present inventive concept the magnetic antenna current as seen by a classical antenna tuner is reduced to the same order of magnitude as when the classical antenna tuner is used with an electrical antenna. This is achieved by inserting a transfer unit between a classical antenna tuner and the magnetic antenna.

The transfer unit, which will be described in more detail, increases the resistive part of the impedance seen by the tuner by means of a variable serial capacitance and a parallel (shunt) inductance connected to system earth. In effect, the current It in the tuner is significantly less than the current Ia in the antenna, which reduces the power losses in the tuner by a factor $(It/Ia)^2$.

The overall impedance matching is a two stage process. The transfer unit provides a first stage rough tuning that enables a classical antenna tuner to perform a second stage fine tuning as known from prior art to obtain a voltage standing wave ratio (VSWR) for efficient power transfer, even with a magnetic antenna. The transfer unit is transparent to the antenna and to the classical tuner.

The transfer unit comprises a serial capacitance and a parallel (shunt) inductance. The serial capacitance is variable and may be built from a set of fixed capacitances that are selectively engaged or disengaged, for example by means of relays, and thus included or excluded from contributing to the serial capacitance. The inductance is fixed.

The capacitors providing the serial capacitance, relays, the inductor or inductors providing the parallel (shunt) inductance and the radiating element, should be low loss components and be rated for the high currents and voltages known to appear when operating a magnetic antenna.

The transfer unit also comprises a control unit for selectively engaging and disengaging a capacitor or a combination of capacitors as a function of operating frequency to obtain the serial capacitance required. The control unit can find the operating frequency value by measuring the antenna signal. Alternatively the control unit may receive the operating frequency value from the antenna tuner via a data link.

A bank of capacitors organized in a parallel array whereby the capacitance doubles for each capacitor, the resulting capacitance is selectable in steps determined by the capacitor having the smallest capacitance. The correct capacitors can be engaged by means of a binary encoded number as known in the art. Thus, a bank of eight capacitors provides 256 resulting capacitance values.

This is few capacitors compared to known integrated systems for use with a magnetic antenna, but according to the inventive concept the transfer unit will only do a rough tuning and leave the fine tuning to a classical antenna tuner. Thus, the fewer capacitive steps are adequate. Additionally, by carrying out the tuning process in two stages, no high precision components or complex lookup tables are required.

The smallest binary step chosen for the capacitors, which corresponds to capacitance associated with the least significant bit (LSB) in a binary encoding, is greater than the tolerance of the capacitor associated with the most significant bit (MSB). To simplify the design, the other bits can be chosen to have the same tolerance. For example, if the MSB has a value of 640 pF and the LSB has a value of 10 pF then the tolerance must be better than 1000/640% or approximately 1.5%. In practice, a tolerance of 1% is easily obtainable for high quality, high current and high voltage capacitors.

The minimum capacitance step value required to adjust the capacitance to a sufficient degree of accuracy for the classical antenna tuner to do the fine tuning, depends on the radio frequency. At the lower end of the frequency range, the capacitance must be high, but the minimum capacitance step can be larger than for higher frequencies.

If installing for example 10 capacitors, multiple subsets of fewer capacitors may be created because it is not necessary to use all installed capacitors over the full frequency range such as a subset of seven capacitors provides 128 capacitance steps in a binary encoding scheme. The capacitor with the smallest capacitance in the subset is associated with the LSB and the capacitor with the largest capacitance in the subset is associated with the MSB. The MSB capacitance is only needed at low frequencies. As the frequency increases the MSB capacitance may be removed from the subset and a new smaller LSB capacitance included in the subset keeping the binary encoded capacity at a seven bit binary number.

The number of capacitance steps is the same for all of the six potential seven bit subsets available with 10 capacitors. Thus, the required precision for the capacitors will be $1/128$ or approximately 1% even if the total frequency range requires more than 128 capacitance steps for adequate tuning.

The transfer unit comprises a switch that allows the radio frequency (RF) signal to bypass the capacitance and inductance installed in the transfer unit. The switch provides a first route, a direct route, for the RF-signal through the transfer unit to the antenna and a second route via the capacitance and inductance.

The two alternative routes solve the open capacitor circuit problem described above. The control unit operates the switch to select the first direct route when the radio frequency is greater than or equal to predetermined value, for example 8 MHz, and to select the second route for lower frequencies.

The type of capacitor and the switching devices for route selection and for engaging and disengaging capacitors need some considerations. The value of the capacitors and the stray capacitances should give a system resonant frequency slightly less than the required minimum frequency. The quality factor (Q) of the capacitor should be 1000 or more. The Q of the parallel (shunt) inductance is less critical because of its relative low value of reactance.

There is thus provided a transfer unit for transferring a radio frequency signal between a classical antenna tuner and an antenna, where the transfer unit comprises a switch for alternatively selecting a first direct route for the radio frequency signal between the tuner and the antenna or a second route via a reactive element; said reactive element comprising a variable serial capacitance and a shunt inductance connected to system earth; and where a control unit controls the switch and is adapted to select the first route when the frequency is above a predetermined value and otherwise select the second route.

In the transfer unit said variable serial capacitance may comprise a set of capacitors organized as a set of binary weighted parallel capacitance values, and where the transfer unit further comprises switches to engage or disengage each capacitor from the reactive element to form a resulting capacitance and where the control unit controls the switches and is adapted to engage and disengage different combinations of the capacitors to increase or decrease the resulting capacitance as the radio frequency is decreased or increased.

The control unit of the transfer unit may be adapted to use a subset of the capacitors for one range of frequencies and a different subset of the capacitors for a different range of frequencies.

The control unit of the transfer unit may be connected to a sensor for measuring the radio frequency. The sensor may be a ferrite current probe.

The control unit of the transfer unit may be connected to a data link and is enabled to receive frequency values via the data link.

There is also provided a method for alternatively using an electrical antenna or a magnetic antenna with a classical antenna tuner, where the alternative steps of:
selecting a first and direct radio frequency signal route between the tuner and the antenna when the frequency is above a predetermined value; or else
selecting a second radio frequency signal route via a reactive element between the tuner and the antenna, the reactive element having a variable serial capacitance and a parallel, or shunt, inductance, and setting the variable capacitance to a value making the reactance transparent to the tuner and antenna.

BRIEF DESCRIPTION OF THE DRAWINGS

The inventive concept is described in more detail by means of an example embodiment and reference is made to accompanying drawings where.

DETAILED DESCRIPTION OF THE DRAWINGS

Figure 1:
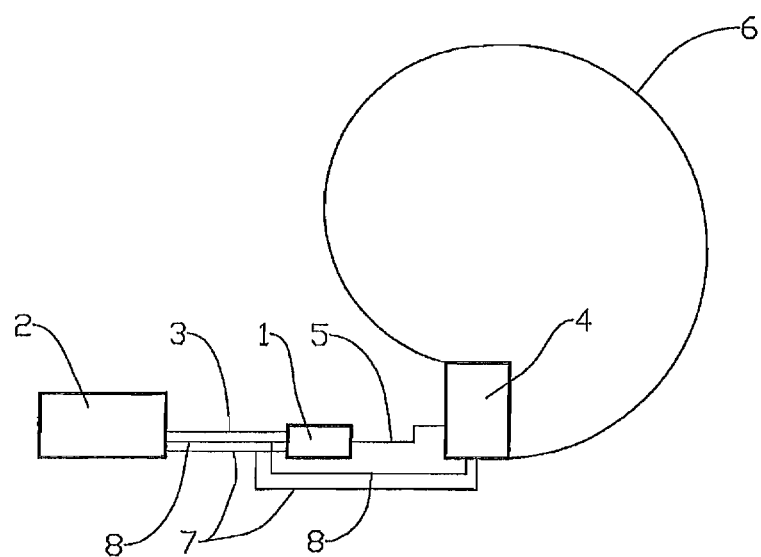
FIG. 1 shows diagram with a loop antenna, a series/parallel transfer unit, a tuner and a radio set.

In FIG. 1 the reference numeral 1 designates an antenna tuner known in the art where the left hand side is connected to a radio set 2 by means of a first radio frequency (RF) connection 3. The right hand side of the tuner 1 is connected to a transfer unit 4 by a second radio frequency connection (RF-connection) 5. The transfer unit 4 is connected to a detachable loop antenna element 6. The loop antenna element 6 can be replaced by a not shown whip or long wire antenna element while keeping the transfer unit 4 in place.

The loop antenna 6 or said alternative whip or long wire antenna is preferably connected to the transfer unit 4 by means of an antenna connector known in the art (not shown). The transfer unit 4 will be described in more detail below.

Depending on the antenna tuner 1 and radio set 2 in use, a data link 7 is used between the tuner 1 and radio set 2 to allow the radio set 2 to control the tuner 1 operation. Depending on the kind of antenna tuner 1 and radio set 2, a power link 8 may feed power from the radio set 2 to the tuner 1. Depending on alternative solutions utilized in the transfer unit 4, the data link 7 is also connected to the transfer unit 4 to allow the radio set 2 or tuner 1 to control the operation of the transfer unit 4. Power to the transfer unit 4 may also be supplied via the power link 8 as shown in FIG. 1.

Figure 2:
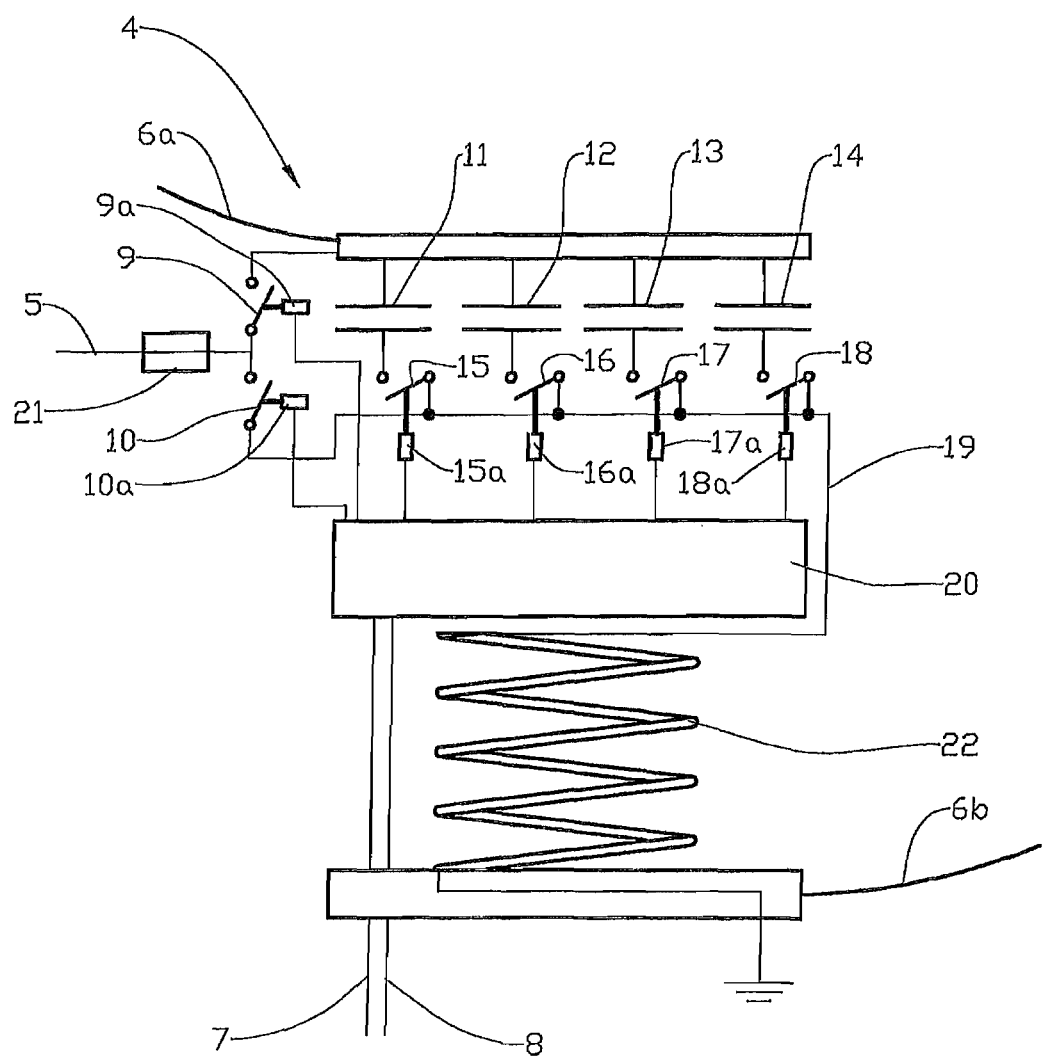
FIG. 2 shows an enlarged diagram of the series/parallel transfer unit internals.

The diagram in FIG. 2 represents the transfer unit 4 with the first end 6a and second end 6b of the loop antenna element 6. The RF connection 5 is connected to a switch 9 of a first relay 9a and a switch 10 of second relay 10a. Activating relay 9a and deactivating relay 10a provides a first route for the RF signal between the RF-connection 5 and the antenna element 6 by closing switch 9 and opening switch 10.

Deactivating relay 9a and activating relay 10a provides a second route for the RF signal between the RF-connection 5 and the antenna element 6.

Said first route connects the RF-connection 5 directly to the first end 6a of the loop antenna element 6. Said second route connects the RF-connection 5 to the first end 6a of the loop antenna element 6 via a stepwise variable capacitance comprising multiple parallel capacitors 11, 12, 13, 14.

One leg of each capacitor 11, 12, 13, 14 is connected to the first end 6a of the loop antenna element 6. The other leg of capacitor 11 is connected to a switch 15 of a relay 15a, the other leg of capacitor 12 is connected to a switch 16 of a relay 16a, the other leg of capacitor 13 is connected to a switch 17 of a relay 17a and the other leg of capacitor 14 is connected to a switch 18 of a relay 18a.

Each switch 15, 16, 17, 18 is connected to switch 10 via a common link 19. When switch 9 is open and switch 10 is closed, and thereby selecting said second route for the RF signal, the capacitance may be selected by closing one or more of the switches 15, 16, 17, 18 by means of activating the corresponding relay 15a, 16a, 17a, 18a.

Capacitor 11 has the smallest capacitance of the capacitors 11, 12, 13, 14. The capacitance value of capacitor 12 is twice the capacitance of capacitor 11. The capacitance of capacitor 13 is twice the capacitance of capacitor 12, hence four times the capacitance of capacitor 11. The capacitance of capacitor 14 is twice the capacitance of capacitor 13, hence eight times the capacitance of capacitor 11.

The array of capacitors and corresponding switches can be extended by adding more capacitors and corresponding switches in a binary weighted system as explained. Ordering the capacitors from the smallest to the largest capacitance, the capacitance of any capacitor except the capacitor with the smallest capacitance, is twice the capacitance of the preceding capacitor. The smallest capacitance determines the smallest capacitance step available when increasing or decreasing the capacitance by means of relays 15a, 16a, 17a, 18a.

Relays 9a, 10a, 15a, 16a, 17a, 18a are activated and deactivated by a control unit 20. The four capacitors 11, 12, 13, 14 provide sixteen combinations for the corresponding switches 15, 16, 17, 18 being open or closed. The combinations are identified by four binary digits (bits) resembling binary numbers ranging from 0000 to 1111 where bit value zero means switch open and bit value one means switch closed.

Adding more capacitors and switches/relays will provide more combinations in the capacitance range available. The target capacitance depends on the radio frequency and the control unit 20 activates the relays 10a, 15a, 16a, 17a, 18a accordingly.

There are three main alternatives for the control unit to determine the correct setting of the switches 15, 16, 17, 18. As a first alternative the control unit 20 can measure the frequency by means of a connected sensor 21 sensing the RF signal, and find the corresponding setting of the switches 15, 16, 17, 18 via a lookup table or by calculate a target capacitance and determining the corresponding setting of the switches 15, 16, 17, 18. A ferrite current probe can be used for the sensor 21 as a signal pickup for frequency measurements.

As a second alternative the control unit 20 may receive frequency information via the data link 7 and determine the corresponding setting of the switches 15, 16, 17, 18 via a lookup table or by calculate target capacitance and corresponding setting of the switches 15, 16, 17, 18.

As a third alternative the control unit 20 may receive the correct switch setting via the data link 7.

The electronics and software for a control unit 20 performing the operations described is well within the capabilities of the skilled person, for example by utilizing a microcontroller for communicating via the data link 7 and activating the relays 9a, 10a, 15a, 16a, 17a, 18a. Thus, the electronics and software for the control unit 20 is not described in more detail.

One leg of an inductor 22 is connected between the common link 19 and the second end 6b of the antenna element 6, which is also connected to system earth.

The circuitry of control unit 20 circuits can be located between the array of capacitors 11, 12, 13, 14 and the inductor 22 to reduce the number of cables that need to be threaded through the inductor 22.

Figure 3:
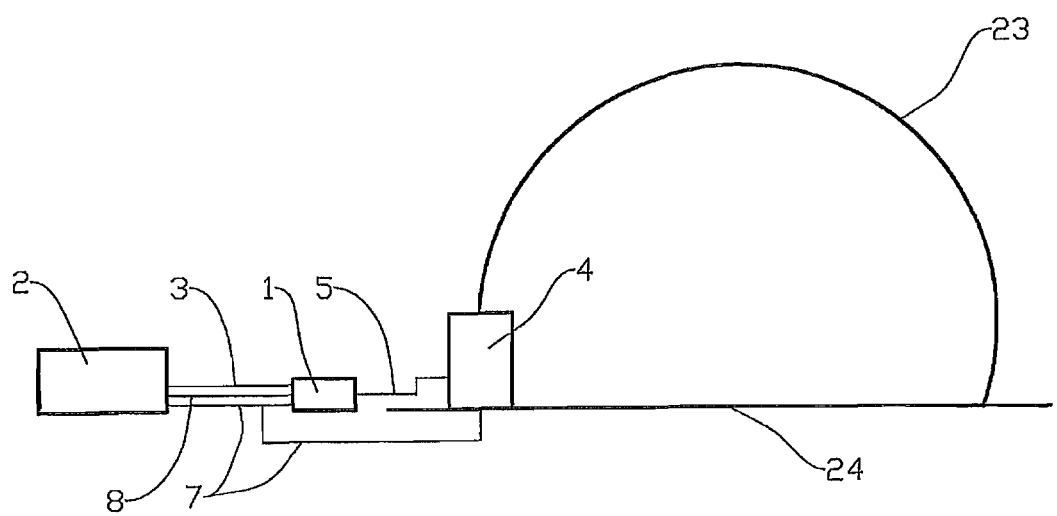
FIG. 3 shows a diagram similar to the diagram in FIG. 1 utilizing a half loop antenna.

The diagram in FIG. 3 shows an arrangement similar to the arrangement in FIG. 1, but with a half loop antenna element 23 and a ground plane 24. The first end of the half loop antenna element 23 is connected to the transfer unit 4 as shown for element end 6a in FIG. 2. The second end of the half loop element 23 is connected to the ground plane 24 which is connected to the inductor 22 in the transfer unit 4 as shown for the element end 6b in FIG. 2. The actual capacitance required, and hence the capacitance of capacitors 11, 12, 13, 14 will depend on the total inductance of the half loop. If the total inductance of the half loop in FIG. 3 is approximately the same as the total inductance of the loop in FIG. 1, the same capacitors should do for both loops.

The capacitor 11 is the smallest capacitance in the arrangement and is represented by the least significant bit (LSB) in the binary encoded number defining the combination of engaged/disengaged capacitors 11, 12, 13, 14. Likewise, capacitor 14 is the largest single capacitance and is represented by the most significant bit (MSB) in the binary encoded number. The capacitance of a capacitor comes at a tolerance.

The capacitance of capacitor 11 must be greater than the tolerance of capacitor 14. In general, the capacitance step value represented by the LSB must be greater that the tolerance in the capacitance represented by the MSB. If the capacitance of capacitor 11 (LSB) is 10 pico Farads (pF) and capacitor 14 (MSB) is 80 pF, the tolerance of capacitor 14 should be less than 10 pF. If more capacitors are added to make the MSB capacitance 640 pF, the tolerance of the MSB capacitance should still be less than 10 pF or approximately 1.5%. High voltage, high current capacitors are available at 1% tolerance or less.

The current I is calculated as the square root of the power P divided by total resistance R of the transfer unit 4 and the radiating element 6 or the radiating element 23 and the ground plane 24:

$$I=\sqrt{P/R}$$

The voltage U across the capacitors 11, 12, 13, 14 is calculated as the product of the reactance X of either the capacitor or the inductor and the current I:

$$U=XI$$

When the radio signal frequency is above a predetermined value, for example above 8 MHz, the control unit 20 activates the relay 9a and deactivates relay 10a, thereby closing switch 9 and opening switch 10 to select the first RF-signal route directly to the antenna element 6. For lower frequencies the control unit 20 reverses the switches 9, 10 to select the second RF-signal route via the capacitance to the antenna element 6, and the control unit 20 activates a combination of relays 15a, 16a, 17a, 18a, corresponding switches 15, 16, 17, 18 and capacitors 11, 12, 13, 14 required to make the transfer unit 4 transparent to the antenna 6 and the tuner 1.

Depending on the required capacity range and the smallest tuning step, the array of four capacitors 11, 12, 13, 14 may be changed to any practical number for capacitors in a binary encoding scheme. The tolerance of the capacitor associated with the MSB in the binary encoding, should be less than the capacitance of the capacitor associated with the LSB as explained.

It may be practical to install more capacitors and use a subarray of capacitors for one frequency range and a different subarray of capacitors for a second frequency range. With an array of six capacitors, it may be feasible to use a subset of four consecutive capacitors and exclude the MSB capacitor of the subset and include a new capacitor at the LSB end of the subset as the frequency increases.

The invention claimed is:

1. An antenna system comprising:
an antenna;
a tuner including a series inductance and a parallel capacitance;
a transfer unit for transferring radio frequency signals between the antenna and the tuner, the transfer unit including a reactive element comprising a variable series capacitance and a shunt inductance connected to system ground, the transfer unit further comprising a switch connected between the tuner, the antenna, and the reactive element; and
a control unit adapted to control the switch to operate in a first configuration to bypass the reactive element in an electrical connection between the tuner and the antenna when a frequency of the radio signals is above a predetermined value and further adapted to control the switch to operate in a second configuration to connect the reactive element between the tuner and the antenna when the frequency of the radio signals is below the predetermined value.

2. An antenna system according to claim 1, wherein said variable serial capacitance comprises a set of capacitors organized as a set of binary weighted parallel capacitance values, and where the transfer unit further comprises switches to engage or disengage each capacitor from the reactive element to form a resulting capacitance and where the control unit controls the switches and is adapted to engage and disengage different combinations of the capacitors to increase or decrease the resulting capacitance as the frequency of radio signals decrease or increase.

3. An antenna system according to claim 2, wherein the control unit is adapted to control a first subset of the capacitors for one range of frequencies and a second subset of the capacitors for a different range of frequencies.

4. An antenna system according to claim 2, further comprising a sensor connected to the control unit, the sensor being adapted to measure the frequency of the radio frequency signals output by the tuner, the control unit further operating to determine a combination of the capacitors to engage and disengage based upon the measured frequency.

5. An antenna system according to claim 4, wherein the sensor is a ferrite current probe.

6. An antenna system according to claim 1, further comprising a data link connected to the control unit, the control unit being adapted to receive frequency values via the data link.

7. An antenna system according to claim 1, wherein the antenna is a magnetic antenna.

8. An antenna system according to claim 1, wherein the antenna is an electric antenna.

9. An antenna system according to claim 2, wherein the control unit is connected to a sensor for measuring a frequency of the radio frequency signals.

10. An antenna system according to claim 2, wherein the control unit is connected to a data link and is enabled to receive frequency values via the data link.

11. An antenna system according to claim 3, wherein the control unit is connected to a sensor for measuring a frequency of the radio frequency signals.

12. An antenna system according to claim 3, wherein the control unit is connected to a data link and is enabled to received frequency values via the data link.

13. An antenna system according to claim 1, wherein the switch is operable to alternatively select between a first route for the radio frequency signal between the tuner and the antenna, bypassing the reactive element, and a second route between the tuner and the antenna via the reactive element.

14. A method for transferring radio frequency signals by means of an antenna system according to claim 1, the method comprising the steps of:
when the frequency of the radio signals is below the predetermined value, directing the radio frequency signals between the antenna and the tuner via the reactive element; and
when the frequency of the radio signals is above a predetermined value, bypassing the reactive element and transfer the radio frequency signals directly between the tuner and the antenna.

15. The method according to claim 14, wherein the method comprises the steps of:
when the frequency of the radio signals is below the predetermined value, preforming a first rough tuning of the radio frequency signals by means of the reactive element of the transfer unit; and performing a second, fine tuning of the radio frequency signals by means of the tuner.

16. The method according to claim 14, wherein the method further comprises setting the predetermined value to 8 MHz, above which the radio frequency signals will bypass the reactive element of the transfer unit, and below which the radio frequency signals will be transferred via the reactive element of the transfer unit.

17. An antenna system comprising:
an antenna;
a tuner including a series inductance and a parallel capacitance;
a transfer unit that transfers radio frequency signals from the tuner to the antenna, the transfer unit comprising a switch connected to the tuner, the antenna, and a reactive element comprising a variable series capacitance and a shunt inductance connected to system ground, the switch operable between a first transfer route wherein the radio frequency signals are directly transferred from the tuner to the antenna and a second transfer route wherein the radio frequency signals are transferred from the tuner, through the reactive element to the antenna; and
a control unit that operates the switch between the first transfer route and the second transfer route and the control unit operates the switch in the first transfer route when a frequency of the radio frequency signal is above a predetermined value and when the frequency is below the predetermined value, the control unit operates the switch in the second transfer route and controls the variable series capacitance based upon the frequency such that a reactance of the reactive element is transparent to the tuner and the antenna.

18. An antenna system according to claim 17, wherein said variable series capacitance comprises a set of capacitors organized as a set of binary weighted parallel capacitance values, and where the transfer unit further comprises switches to engage or disengage each capacitor from the reactive element to form a resulting capacitance and where the control unit controls the switches and is adapted to engage and disengage different combinations of the capacitors to increase or decrease the resulting capacitance as the radio frequency is decreased or increased.

19. An antenna system of claim 18, wherein the transfer unit provides a rough tuning based upon operation of the switch and reactive element and the tuner provides fine tuning to obtain a voltage standing wave ratio for efficient power transfer.

* * * * *